United States Patent
Sakakibara

(10) Patent No.: US 9,806,000 B2
(45) Date of Patent: Oct. 31, 2017

(54) SEMICONDUCTOR DEVICE AND MANUFACTURING METHOD OF SEMICONDUCTOR DEVICE

(71) Applicant: Toyota Jidosha Kabushiki Kaisha, Toyota-shi Aichi-ken (JP)

(72) Inventor: Akinori Sakakibara, Toyota (JP)

(73) Assignee: Toyota Jidosha Kabushiki Kaisha, Toyota-shi (JP)

(*) Notice: Subject to any disclaimer, the term of this patent is extended or adjusted under 35 U.S.C. 154(b) by 0 days.

(21) Appl. No.: 15/216,767

(22) Filed: Jul. 22, 2016

(65) Prior Publication Data

US 2017/0025323 A1 Jan. 26, 2017

(30) Foreign Application Priority Data

Jul. 24, 2015 (JP) .................. 2015-147108

(51) Int. Cl.
| | |
|---|---|
| *H01L 23/367* | (2006.01) |
| *H01L 23/31* | (2006.01) |
| *H01L 23/36* | (2006.01) |
| *H01L 23/373* | (2006.01) |
| *H01L 23/433* | (2006.01) |

(52) U.S. Cl.
CPC .......... *H01L 23/3121* (2013.01); *H01L 23/36* (2013.01); *H01L 23/3737* (2013.01); *H01L 23/4334* (2013.01)

(58) Field of Classification Search
CPC .. H01L 23/3121; H01L 23/36; H01L 23/3737
See application file for complete search history.

(56) References Cited

U.S. PATENT DOCUMENTS

2014/0061704 A1   3/2014   Yamada et al.

FOREIGN PATENT DOCUMENTS

| JP | 2012222291 A | 11/2012 |
| JP | 2014049642 A | 3/2014 |

*Primary Examiner* — Long Pham
(74) *Attorney, Agent, or Firm* — Dinsmore & Shohl LLP

(57) ABSTRACT

A bonding member is a member shaped in a sheet and made of electrically-insulating resin. A semiconductor module includes a heatsink and a cooler that are electrically insulated from each other by the bonding member. The bonding member includes a central portion and a peripheral portion. A heat conductivity in a normal direction of the central portion is greater than a heat conductivity in the normal direction of the peripheral portion. Further, a heat conductivity in a surface direction of the peripheral portion is greater than a heat conductivity in the surface direction of the central portion. Further, the heat conductivity in the normal direction of the central portion is greater than the heat conductivity in the surface direction of the central portion.

5 Claims, 7 Drawing Sheets

SEMICONDUCTOR DEVICE AND MANUFACTURING METHOD OF SEMICONDUCTOR DEVICE

CROSS-REFERENCE TO RELATED APPLICATION

This application claims priority to Japanese Patent Application No. 2015-147108 filed on Jul. 24, 2015, the entire contents of which are hereby incorporated by reference into the present application.

TECHNICAL FIELD

The present teachings disclose a technology that relates to a semiconductor device and a manufacturing method thereof

DESCRIPTION OF RELATED ART

Japanese Patent Application Publication No. 2012-222291 discloses a semiconductor device including a semiconductor element, a heatsink, mold resin, and a cooler. The semiconductor element is fixed an upper surface of the heatsink. The mold resin seals a vicinity of the semiconductor element and an upper surface side of the heatsink so that a lower surface of the heatsink is exposed. A ceramic plate serving as an electric insulator is attached to the lower surface of the heatsink, and the ceramic plate is fixed onto the cooler via heat dissipation grease.

SUMMARY

In the technology disclosed in Japanese Patent Application Publication No. 2012-222291, the ceramic plate and the heat dissipation grease are interposed between the lower surface of the heatsink and the cooler. The heat dissipation grease is designed to have a higher heat conductivity but cannot be said to have a sufficiently high heat conductivity. Under such circumstances, there has been a demand for a thither reduction in heat resistance between the heatsink and the cooler. A decrease in heat resistance may be achieved by replacing the ceramic plate and the heat dissipation grease with a bonding member shaped in a sheet and made of insulating resin. However, when using an ordinary sheet, some problems are generated.

Normally, the heatsink is bonded to the cooler, which spreads more widely than the heatsink. The bonding member, which is located between the heatsink and the cooler, is required to have two functions:
(1) In a range overlapping with the semiconductor element, which generates heat, cooling the semiconductor element by transferring the heat in a normal direction of the bonding member; and
(2) In a range positioned around the semiconductor element, which generates heat, allowing the heat from the semiconductor element to be transferred to a wide range of the cooler by transferring the heat in a surface direction of the bonding member.

As noted above, the bonding member is expected to have portions that differ in heat conductivity performance from each other. However, an ordinary sheet cannot fulfill the requirements.

The present teachings discloses a technology that can achieve high dissipation performance by utilizing a bonding member shaped in a sheet and made of insulating resin.

The present teachings disclose a semiconductor device. The semiconductor device comprises: a semiconductor module; a bonding member; and a cooler. The semiconductor module comprises; a heatsink; a semiconductor element disposed at an inner surface side of the heatsink; and mold resin sealing the inner surface side of the heatsink and a circumference of the semiconductor element, wherein an outer surface of the heatsink is exposed on a surface of the semiconductor module that is bonded to the cooler via the bonding member, and the mold resin surrounds a circumference of the heatsink. The bonding member is shaped in a sheet and made of insulating resin, the bonding member comprises a first portion overlapping with the semiconductor element and a second portion overlapping with the mold resin when observed along a normal direction of the heatsink, wherein a heat conductivity in the normal direction of the first portion is greater than a heat conductivity in the normal direction of the second portion, when a direction perpendicular to the normal direction is set as a surface direction, a heat conductivity in the surface direction of the second portion is greater than a heat conductivity in the surface direction of the first portion, and the heat conductivity in the normal direction of the first portion is greater than the heat conductivity in the surface direction of the first portion. The outer surface of the heatsink and the mold resin surrounding the circumference of the heatsink are bonded to the cooler via the bonding member.

According to the configuration described above, the heat conductivity in the normal direction of the first portion, Which overlaps with the semiconductor element when observed along the normal direction, is greater than the heat conductivity in the surface direction of the first portion. Therefore, the first portion cools the semiconductor element by transferring heat in the surface direction of the bonding member. On the other hand, the heat conductivity in the normal direction of the second portion, which overlaps with the mold resin when observed along the normal direction, is lower than the heat conductivity in the normal direction of the first portion, but the heat conductivity in the surface direction of the second portion is greater than the heat conductivity in the surface direction of the first portion. Therefore, the second portion can transfer more heat in the surface direction of the bonding member than the first portion, thus allowing the heat from the semiconductor element to be transferred to a wide range of the cooler. That is, the semiconductor device described above can achieve high heat dissipation performance by utilizing the bonding member shaped in a sheet and made of insulating resin.

The present teachings further disclose a manufacturing method of the semiconductor device. The method comprises: disposing a semiconductor element at an inner surface side of a heatsink; forming mold resin such that the mold resin seals the inner surface side of the heatsink and a circumference of the semiconductor element, and surrounds a circumference of the heatsink, wherein the surrounding portion of the mold resin projects to a bonding member side than an outer surface of the heatsink; disposing the bonding member between a cooler and an end surface of the mold resin surrounding the outer surface of the heatsink and a circumference of the heatsink, the bonding member containing dispersion particles dispersed therein with a posture that causes a heat conductivity in a nomad direction to be greater than a heat conductivity in a surface direction; and pressure-bonding the outer surface of the heatsink and the end surface of the mold resin to the cooler via the bonding member, so as to cause the posture of the dispersion particles contained in the bonding member in a range positioned between the end surface of the mold resin and the cooler to be changed.

This method causes the mold resin to project to the bonding member side than the outer surface of the heatsink. Therefore, when the outer surface of the heatsink and the end surface of the mold resin are pressure-bonded to the cooler via the bonding member, a higher pressure is applied to a portion of the bonding member that faces the mold resin than to a portion of the bonding member that faces the heatsink. As a result, the portion of the bonding member that faces the mold resin can cause the postures of more of the dispersion particles to be changed than the portion of the bonding member that faces the heatsink. Consequently, in the bonding member thus formed, a proportion of the dispersion particles with a posture that increases the heat conductivity of the normal direction is higher in the portion of the bonding member that faces the outer surface of the heatsink than in the portion of the bonding member that faces the mold resin, and a proportion of the dispersion particles with a posture that increases the heat conductivity of the surface direction is higher in the portion of the bonding member that faces the mold resin than in the portion of the bonding member that faces the our surface of the heatsink. Therefore, in the semiconductor device manufactured by this method, the portion of the bonding member that faces the heatsink cools the semiconductor element by transferring heat in the normal direction of the bonding member. On the other hand, the portion of the bonding member that faces the mold resin can transfer more heat in the surface direction of the bonding member, thus allowing the heat from the semiconductor element to be transferred to a wide range of the cooler. The manufacturing method described above makes it possible to manufacture a semiconductor device having high heat dissipation performance.

EMBODIMENTS (First Embodiment)

Figure 1:
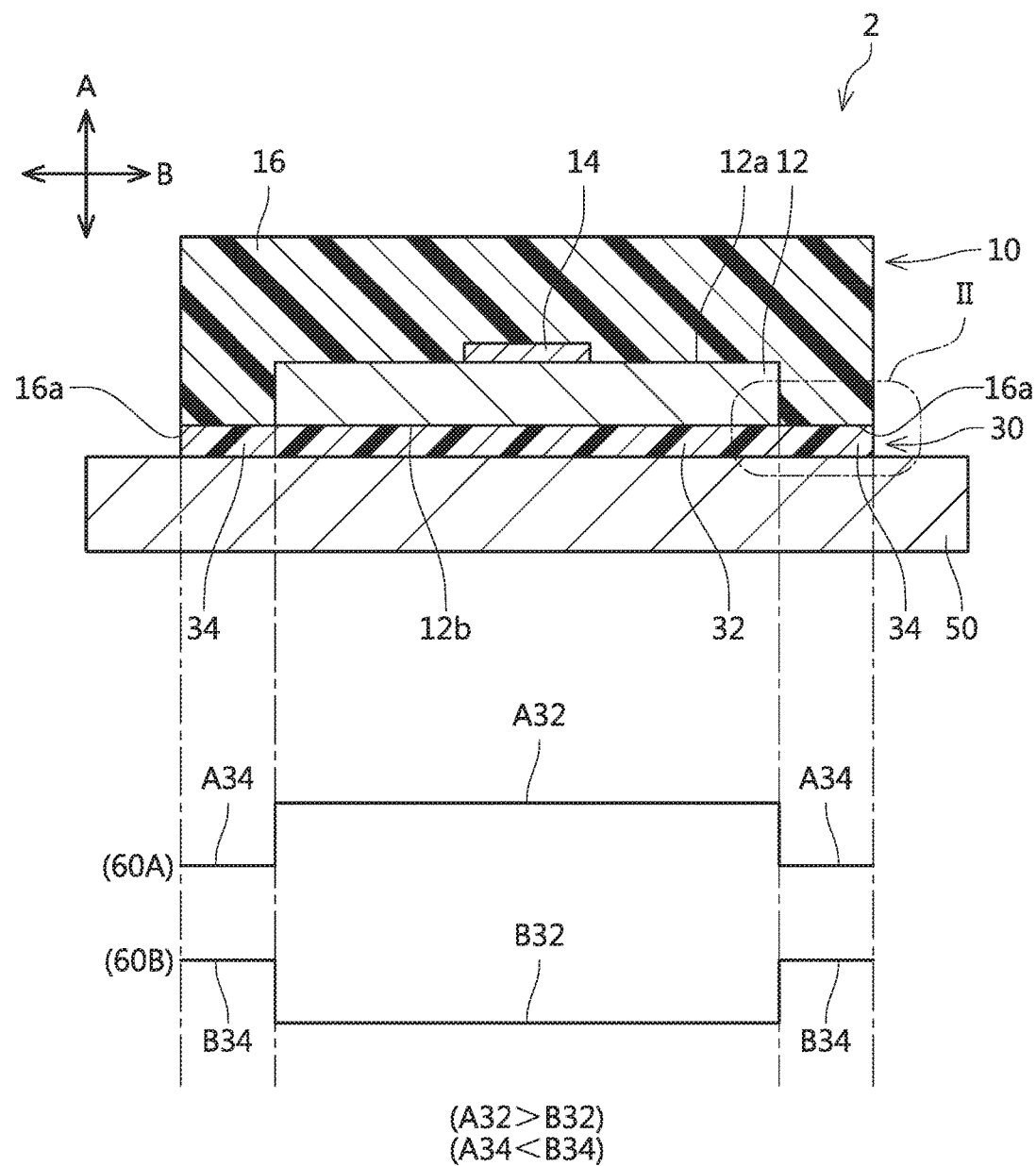
FIG. 1 is a cross-sectional explanatory diagram schematically showing a semiconductor device 2 according to a first embodiment.

As shown in FIG. 1, a semiconductor device 2 according to the present embodiment comprises a semiconductor module 10, a bonding member 30, and a cooler 50. In the semiconductor device 2, the semiconductor module 10 is bonded to the cooler 50 via the bonding member 30.

The semiconductor module 10 comprises a heatsink 12, a semiconductor element 14, and mold resin 16.

The heatsink 12 is a metal member in shape of a plate. The heatsink 12 may for example be made of Cu or Al.

The semiconductor element 14 is a power switching element. In the present embodiment, a vertical IGBT (Insulated Gate Bipolar Transistor) is used as the semiconductor element 14. An emitter electrode and a gate electrode pad (not illustrated) are provided on an upper surface (surface on an upper side of FIG. 1) of the semiconductor element 14, and a collector electrode (not illustrated) is provided on a lower surface of the semiconductor element 14 (surface on a lower side of FIG. 1). The collector electrode on the lower surface of the semiconductor element 14 is connected to an inner surface 12a of the heatsink 12 (surface on the upper side of FIG. 1) via illustrated solder. The heatsink 12, the emitter electrode of the semiconductor element 14, and the gate electrode pad of the semiconductor element 14 are respectively connected to other electrically-conducting members at unillustrated positions.

The mold resin 16 is electrically-insulating resin sealing an inner surface 12a side of the heatsink 12 and a circumference of the semiconductor element 14. Further, the mold resin 16 surrounds a circumference of the heatsink 12.

Figure 2:
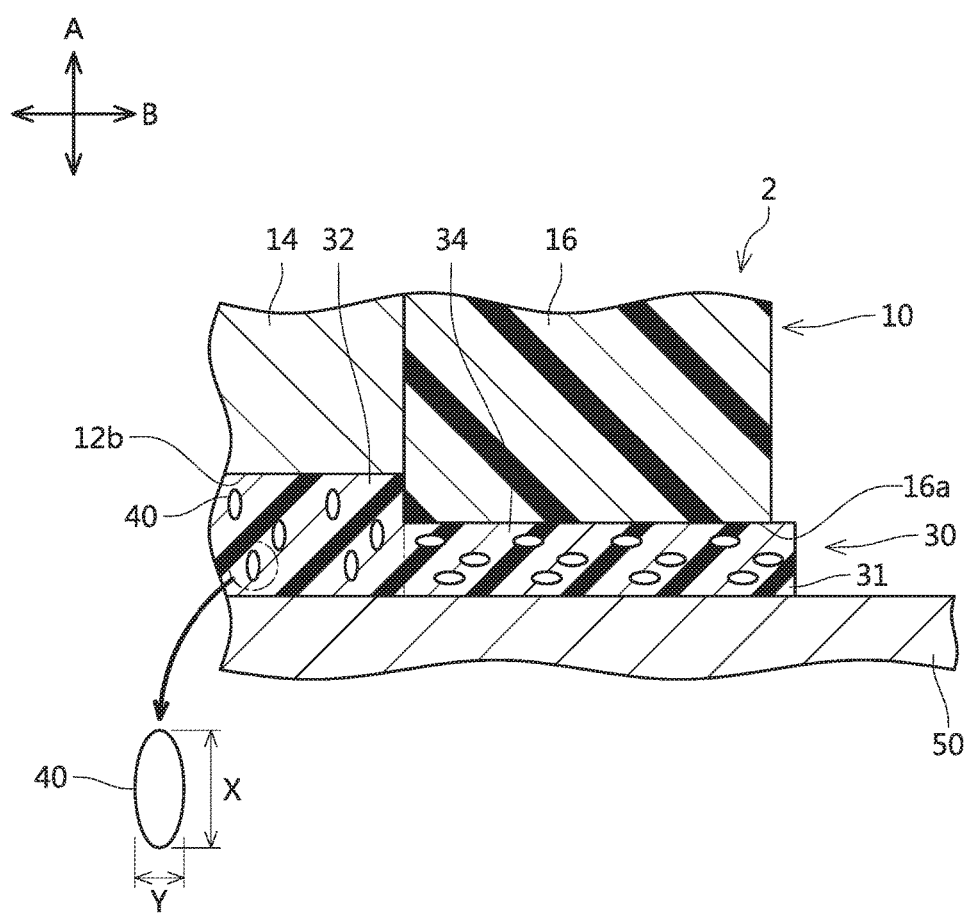
FIG. 2 is a partial enlarged cross-sectional explanatory diagram showing a part of the semiconductor device 2 according to the first embodiment.

An outer surface 12b of the heatsink 12 and an end surface 16a of a portion of the mold resin 16 that surrounds the circumference of the heatsink 12 are exposed on a lower surface of the semiconductor module 10 (surface on the lower side of FIG. 1), the lower surface being bonded to the cooler 50 via the bonding member 30. As shown in FIG. 2, in the present embodiment, the end surface 16a of the mold resin 16 exposed on the lower surface of the semiconductor module 10 projects to a bonding member 30 side than the outer surface 12b of the heatsink 12.

The bonding member 30 is a member shaped in a sheet and made of electrically-insulating resin. The heatsink 12 and the cooler 50 are electrically insulated from each other by the bonding member 30. As shown in FIG. 1, in the present embodiment, the bonding member 30 includes a central portion 32 and a peripheral portion 34. The central portion 32 is a portion overlapping with the heatsink 12 when observed along a normal direction (direction of an arrow A in FIG. 1) of the heatsink 12, and the peripheral portion 34 is a portion overlapping with the end surface 16a of the mold resin 16 when observed along the normal direction. The central portion 32 and the peripheral portion 34 differ in heat conductivity performance from each other A graph 60A of FIG. 1 represents heat conductivities in the normal direction of respective portions of the bonding member 30. Further, when a direction perpendicular to the normal direction is set as a surface direction (direction of an arrow B in FIG. 1), a graph 60B of FIG. 1 represents heat conductivities in the surface direction of respective portions of the bonding member 30. In the graphs 60A and 60B, a higher position in the graphs means a greater heat conductivity. As shown in the graphs 60A and 60B, a heat conductivity A32 in the normal direction of the central portion 32 is greater than a heat conductivity A34 in the normal direction of the peripheral portion 34. Further, when a direction perpendicular to the normal direction is set as a surface direction (direction of an arrow B in FIG. 1), a heat conductivity B34 in the surface direction of the peripheral portion 34 is greater than a heat conductivity B32 in the surface direction of the central portion 32. Further, the heat conductivity A32 in the normal direction of the central portion 32 is greater than the heat conductivity B32 in the surface: direction of the central portion 32. Furthermore, the heat conductivity B34 in the surface direction of the peripheral portion 34 is greater than the heat conductivity A34 in the normal direction of the peripheral portion 34.

The bonding member 30 will now be described in more detail with reference to FIG. 2. The bonding member 30 includes a base member 31 and dispersion particles 40 dispersed in the base member 31. The base member 31 is made of electrically-insulating resin. The dispersion particles 40 are made of resin having a higher heat conductivity than the base member 31 has. The dispersion particles 40 have an elongated shape. A heat conductivity in a longitudinal direction (direction of an arrow X in FIG. 2) of the dispersion particles 40 is greater than a heat conductivity in a transverse direction (direction of an arrow Y in FIG. 2) of the dispersion particles 40. In the first embodiment, the base member 31 has a heat conductivity of 1 W/m·k. The heat conductivity in the longitudinal direction and the heat conductivity in the transverse direction of the dispersion particles 40 are 100 w/m·k and 2 W/m·k, respectively. That is, the bonding member 30 according to the first embodiment comprises a characteristic of having the heat conductivity in the normal direction and the heat conductivity in the surface direction that change in accordance with postures of the dispersion particles 40.

FIG. 2 schematically shows the postures of the dispersion particles 40 in the respective portions of the bonding member 30. In the central portion 32, a proportion of dispersion particles 40 whose longitudinal direction extends along the normal direction is high, and in the peripheral portion 34, a proportion of dispersion particles 40 whose longitudinal direction extends along the surface direction is high. Of course, in actuality, the central portion 32 also has a certain amount of the dispersion particles 40 with a posture other than the postures described above, and the peripheral portion 34 also has a certain amount of the dispersion particles 40 with a posture other than the postures described above.

That is, in the first embodiment, the proportion of the dispersion particles 40 whose longitudinal direction (direction of the arrow X) extends along the normal direction (direction of the arrow A) is higher in the central portion 32 than in the peripheral portion 34, and the proportion of the dispersion particles 40 whose longitudinal direction (direction of the arrow X) extends along the surface direction (direction of the arrow B) is higher in the peripheral portion 34 than in the central portion 32. In other words, a proportion of the dispersion particles 40 with a posture that increases the heat conductivity of the normal direction is higher in the central portion 32 than in the peripheral portion 34, and a proportion of the dispersion particles 40 with a posture that increases the heat conductivity of the surface direction is higher in the peripheral portion 34 than in the central portion 32. This allows the central portion 32 and peripheral portion 34 of the bonding member 30 according to the first embodiment to exhibit the aforementioned anisotropy of heat conductivities.

The cooler 50 is a plate member made of Al. As shown in FIG. 1, when observed along the normal direction, the cooler 50 has a larger area than the semiconductor module When the semiconductor device 2 described above is brought into operation, the semiconductor element 14 generates heat. The heat generated from the semiconductor element 14 is dissipated to the cooler 50 via the heatsink 12 and the bonding member 30. At this occasion, the heat conductivity A32 in the normal direction of the central portion 32 of the bonding member 30 is greater than the heat conductivity B32 in the surface direction of the central portion 32. Therefore, the central portion 32 can cool the semiconductor element 14 by transferring the heat in the normal direction of the bonding member 30. On the other hand, the heat conductivity A34 in the normal direction of the peripheral portion 34 of the bonding member 30 is lower than the heat conductivity A32 in the normal direction of the central portion 32, but the heat conductivity B34 in the surface direction of the peripheral portion 34 is greater than the heat conductivity B32 in the surface direction of the central portion 32. Therefore, the peripheral portion 34 can transfer more heat in the surface direction of the bonding member 30 than the central portion 32, thus allowing the heat to be transferred from the semiconductor element 14 to a wide range of the cooler 50. That is, the semiconductor device 2 according to the present embodiment can achieve high heat dissipation performance by utilizing the bonding member 30 shaped in a sheet and made of insulating resin.

(Method of Manufacturing Semiconductor Device According to First Embodiment)

The following describes a method of manufacturing the semiconductor device 2 of the present embodiment. First, the heatsink 12 is prepared, and the collector electrode on the lower surface of the semiconductor element 14 is connected to the inner surface 12a of the heatsink 12 via solder. Furthermore, predetermined electrically-conducting members are connected to respectively the heatsink 12, the emitter electrode of the semiconductor element 14, and the gate electrode pad of the semiconductor element 14.

Next, the semiconductor module 10 is manufactured by sealing, with the mold resin 16, the circumference of the semiconductor element 14 and the circumference of the heatsink 12 that includes the inner surface 12a side. This causes the circumference of the heatsink 12 to be surrounded by the mold resin 16. Further, at this occasion, the outer surface 12b of the heatsink 12 and the end surface 16a of the mold resin 16 are exposed on the lower surface of the semiconductor module 10 (i.e., a surface to be bonded to the cooler 50 via the bonding member 30). At this occasion, the end surface 16a of the mold resin 16 exposed on the lower surface of the semiconductor module 10 is made to project to the bonding member 30 side than the outer surface 12b of the heatsink 12 (see FIG. 3).

Figure 3:
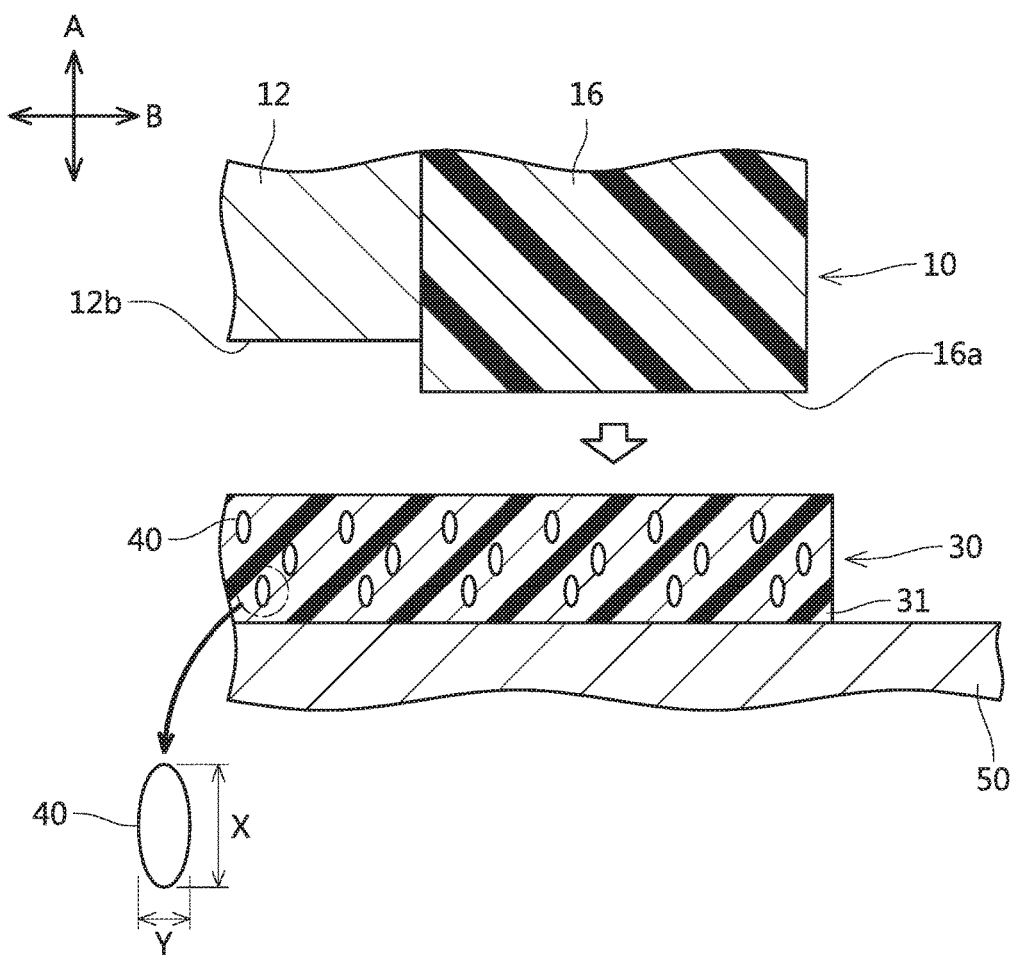
FIG. 3 is a partial cross-sectional explanatory diagram explaining a process for manufacturing the semiconductor device 2 according to the first embodiment.

Next, the cooler 50 is prepared. Then, as shown in FIG. 3, the bonding member 30 is disposed on an upper surface of the cooler 50 (i.e., a surface to be bonded to the semiconductor module 10 via the bonding member 30). As shown in FIG. 3, at this timing, the bonding member 30 does not have the two portions, namely the central portion 32 and the peripheral portion 34. At this timing, the dispersion particles 40 whose longitudinal direction (direction of the arrow X) extends along the normal direction (direction of the arrow A) (i.e., the dispersion particles 40 with a posture that causes the heat conductivity of the normal direction to be greater than the heat conductivity of the surface direction) are dispersed in the base member 31 of the bonding member 30.

Next, the semiconductor module 10 is pressure-bonded to the cooler 50 via the bonding member 30. At this occasion, heat is applied to the bonding member 30. As noted above, in the semiconductor module 10, the end surface 16a of the mold resin 16 projects to the bonding member 30 side than the outer surface 12b of the heatsink 12. Therefore, when the semiconductor module 10 is pressure-bonded to the cooler 50 via the bonding member 30, a higher pressure is applied to a portion of the bonding member 30 that faces the end surface 16a of the mold resin 16 than to a portion of the bonding member 30 that faces the outer surface 12b of the heatsink 12. As a result, the portion of the bonding member 30 that faces the end surface 16a causes the postures of more of the dispersion particles 40 to be changed than the portion of the bonding member 30 that faces the outer surface 12*b* (see FIG. 2). That is, as shown in FIG. 2, the proportion of the dispersion particles 40 whose longitudinal direction (direction of the arrow X) extends along the surface direction (direction of the arrow 13) is increased in the portion of the bonding member 30 that faces the end surface 16*a*. On the other hand, the postures of the dispersion particles 40 change less in the portion that faces the outer surface 12*b* than in the portion that faces the end surface 16*a*. Therefore, the proportion of the dispersion particles 40 whose longitudinal direction (direction of the arrow X) extends along the normal direction (direction of the arrow A) remains high in the portion that faces the outer surface 12*b*. The pressure bonding noted above causes the portion of the bonding member 30 that faces the outer surface 12*b* to form the central portion 32, and causes the portion of the bonding member 30 that faces the end surface 16*a* to form the peripheral portion 34 (see FIG. 2). This causes the semiconductor module 10 to be bonded to the cooler 50 via the bonding member 30.

The semiconductor device 2 according to the first embodiment is manufactured by performing each of the steps described above. The manufacturing method according to the present embodiment makes it possible to manufacture the semiconductor device 2 according to the present embodiment without preparing in advance a bonding member containing therein the dispersion particles 40 having different postures by respective portions.

The following describes a correspondence relationship between the present embodiment and the claims. A portion of the central portion 32 that overlaps with the semiconductor clement 14 when observed along the normal direction of the heatsink 12 is an example of a "first portion". The peripheral portion 34 is an example of a "second portion".

(Second Embodiment)

A semiconductor device 102 according to a second embodiment is described with reference to FIG. 4 with a focus on points of difference from the first embodiment in FIG. 4, components of the semiconductor device 102 according to the second embodiment that are identical to those of the semiconductor device 2 according to the first embodiment (see FIG. 1) are given the same reference signs as in FIG. 1.

A bonding member 130 according to the present embodiment is also a member shaped in a sheet and made of electrically-insulating resin. In the present embodiment, too, the heatsink 12 and the cooler 50 are electrically insulated from each other by the bonding member 130. In the present embodiment, too, as shown in FIG. 4, the bonding member 130 includes a central portion 132 and a peripheral portion 134.

Figure 4:
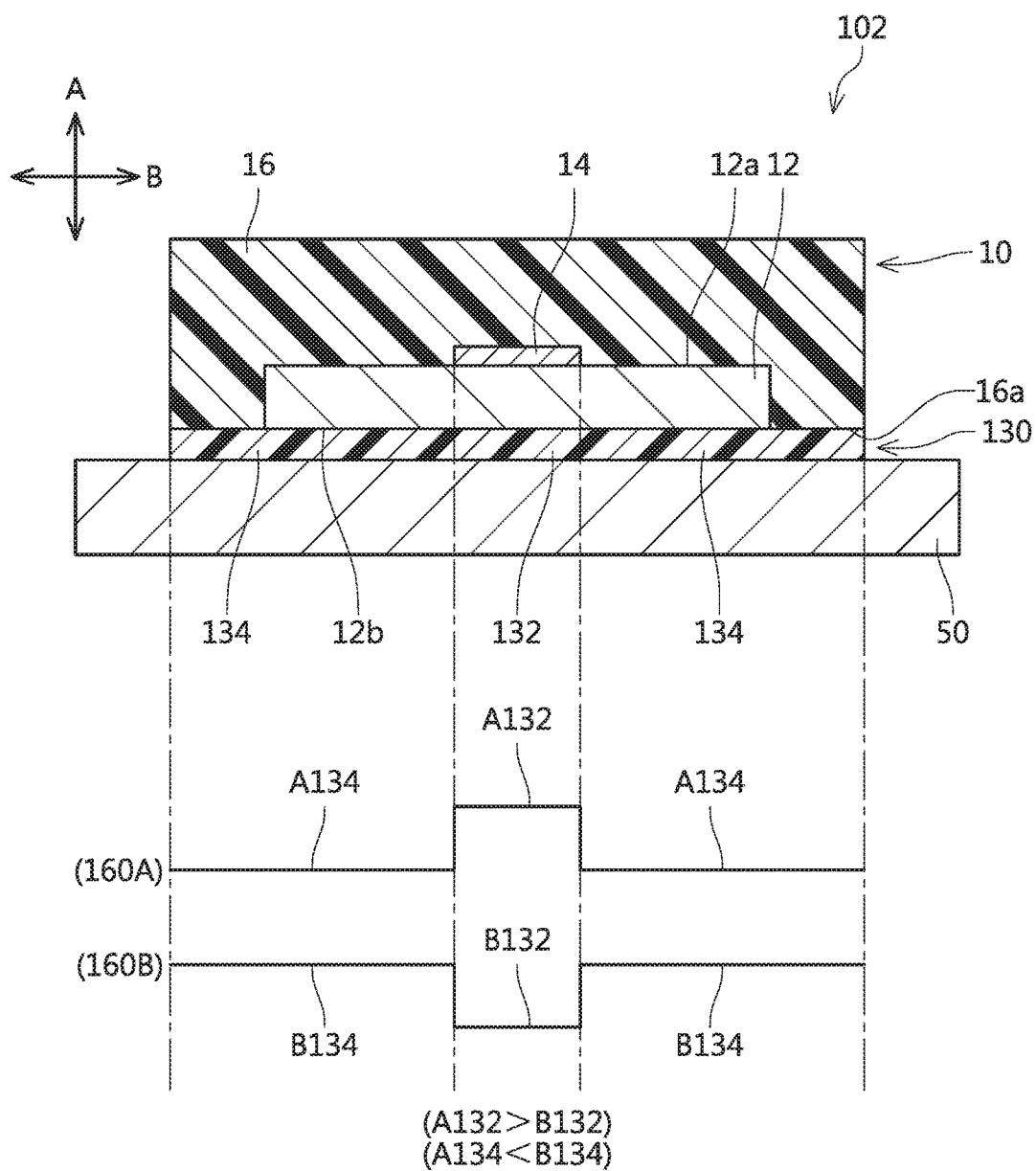
FIG. 4 is a cross-sectional explanatory diagram schematically showing a semiconductor device 102 according to a second embodiment.

In the present embodiment, the central portion 132 is a portion overlapping with the semiconductor element 14 when observed along a normal direction (direction of an arrow A in FIG. 4). The peripheral portion 134 is a portion located outside of the central portion 132.

Although not shown in FIG. 4, in the present embodiment, a portion of the outer surface 12*b* of the heatsink 12 of the semiconductor module 10 that faces the peripheral portion 134 projects to a bonding member 130 side than a portion of the outer surface 12*b* of the heatsink 12 that faces the central portion 132. The portion. of the outer surface 12*b* of the heatsink 12 that faces the peripheral portion 134 is substantially flush with the end surface 16*a* of the mold resin 16.

In the present embodiment, too, as indicated in graphs 160A and 160B in FIG. 4, the central portion 132 and the peripheral portion 134 differ in heat conductivity performance from each other. A heat conductivity A132 in the normal direction of the central portion 132 is greater than a heat conductivity A134 in the normal direction of the peripheral portion 134. Further, a heat conductivity B134 in a surface direction (direction of an arrow B in FIG. 4) of the peripheral portion 134 is greater than a heat conductivity B132 in the surface direction of the central portion 132. Further, the heat conductivity A132 in the normal direction of the central portion 132 is greater than the heat conductivity B132 in the surface direction of the central portion 132. Furthermore, the heat conductivity B134 in the surface direction of the peripheral portion 134 is greater than the heat conductivity A134 in the normal direction of the peripheral portion 134.

Detailed internal structures of the central portion 132 and the peripheral portion 134 (such as the postures of the dispersion particles 40 in each portion) are not described in detail here, as they are identical to the internal structures of the central portion 32 and the peripheral portion 34 according to the first embodiment (see FIG. 2).

When the semiconductor device 102 described above is brought into operation, the semiconductor element 14 generates heat. The heat generated from the semiconductor element 14 is dissipated to the cooler 50 via the heatsink 12 and the bonding member 130. At this occasion, the heat conductivity A132 in the normal direction of the central portion 132 is greater than the heat conductivity B132 in the surface direction of the central portion 132. Therefore, the central portion 132 can cool the semiconductor element 14 by transferring the heat in the normal direction of the bonding member 130. On the other hand, the heat conductivity A134 in the normal direction of the peripheral portion 134 of the bonding member 130 is lower than the heat conductivity A132 in the normal direction of the central portion 132, but the heat conductivity B134 in the surface direction of the peripheral portion 134 is greater than the heat conductivity B132 in the surface direction of the central portion 132. Therefore, the peripheral portion 134 can transfer more heat in the surface direction of the bonding member 130 than the central portion 132, thus allowing the heat from the semiconductor element 14 to be transferred to a wide range of the cooler 50. That is, the semiconductor device 102 according to the present embodiment also can achieve high heat dissipation performance by utilizing the bonding member 130 shaped in a sheet and made of insulating resin.

The following describes a correspondence relationship between the present embodiment and the claims. The central portion 132 is an example of the "first portion", A portion of the peripheral portion 134 that overlaps with the end surface 16*a* of the mold resin 16 is an example of the "second portion".

(Third Embodiment)

Figure 5:
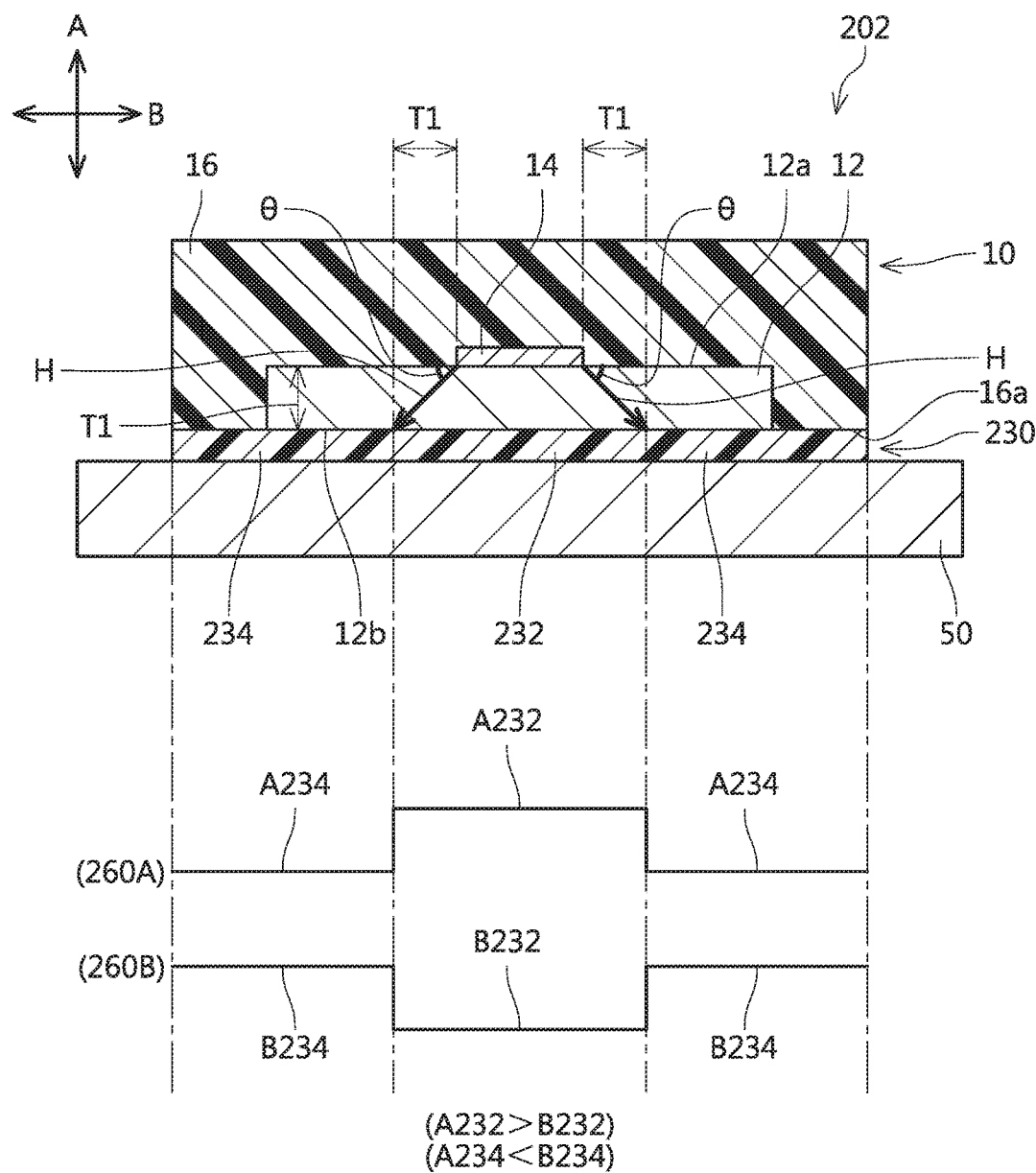
FIG. 5 is a cross-sectional explanatory diagram schematically showing a semiconductor device 202 according to a third embodiment.

A semiconductor device 202 according to a third embodiment is described with reference to FIG. 5 with a focus on points of difference from the first embodiment. In FIG. 5, too, components of the semiconductor device 202 according to the third embodiment that are identical to those of the semiconductor device 2 according to the first embodiment (see FIG. 1) are given the same reference signs as in FIG. 1.

A bonding member 230 according to the present embodiment is also a member shaped in a sheet and made of electrically-insulating resin. In the present embodiment, too, the heatsink 12 and the cooler 50 are electrically insulated from each other by the bonding member 230. As shown in FIG. 5, the bonding member 230 also includes a central portion 232 and a peripheral portion 234.

In the third embodiment, when observed along the normal direction, a boundary between the central portion 232 and the peripheral portion 234 is located at a position apart from the semiconductor element 14 by a distance corresponding to a thickness T1 of the heatsink 12. As will be described in detail later, in the present embodiment, the central portion 232 can be rephrased as a portion to which the heat from the semiconductor element 14 is transferred via the heatsink 12.

Although not shown in FIG. 5, in the present embodiment, a portion of the outer surface 12b of the heatsink 12 of the semiconductor module 10 that faces the peripheral portion 234 projects to a bonding member 230 side than a portion of the outer surface 12b of the heatsink 12 that faces the central portion 232. The portion of the outer surface 12b of the heatsink 12 that faces the peripheral portion 234 is substantially flush with the end surface 16a of the mold resin 16.

In the present embodiment, too, the central portion 232 and the peripheral portion 234 differ in heat conductivity performance from each other. As indicated in graphs 260A and 260B, a heat conductivity A232 in a normal direction (direction of an arrow A in FIG. 5) of the central portion 232 is greater than a heat conductivity A234 in the normal direction of the peripheral portion 234. Further, a heat conductivity B234 in a surface direction (direction of an arrow B in FIG. 5) of the peripheral portion 234 is greater than a heat conductivity B232 in the surface direction of the central portion 232. Further, the heat conductivity A232 in the normal direction of the central portion 232 is greater than the heat conductivity B232 in the surface direction of the central portion 232. Furthermore, the heat conductivity B234 in the surface direction of the peripheral portion 234 is greater than the heat conductivity A234 in the normal direction of the peripheral portion 234.

Detailed internal structures of the central portion 232 and die peripheral portion 234 (such as the postures of the dispersion particles 40 in each portion) are not described in detail here, as they are identical to the internal structures of the central portion 32 and the peripheral portion 34 according to the first embodiment (see FIG. 2).

When the semiconductor device 202 described above is brought into operation, the semiconductor element 14 generates heat. The heat generated from the semiconductor element 14 is dissipated to the cooler 50 via the heatsink 12 and the bonding member 230. At this occasion, as indicated by arrows H in FIG. 5, the heat generated from the semiconductor element 14 is transferred in a thickness direction of the heatsink 12 while spreading and transferred in a direction parallel to a surface of the heatsink 12. That is, the heat from the semiconductor element 14 is radially transferred through the heatsink 12. It is also known than a radiation angle θ at that occasion is approximately 45 degrees. As noted above, when observed along the normal direction, the boundary between the central portion 232 and the peripheral portion 234 is located at the position apart from the semiconductor element 14 by the distance corresponding to the thickness T1 of the heatsink 12. That is, the heat from the semiconductor element 14 is transferred to the central portion 232 via the heatsink 12. Since the heat conductivity A232 in the normal direction of the central portion 232 is greater than the heat conductivity B232 in the surface direction of the central portion 232, the central portion 232 can cool the semiconductor element 14 by transferring the heat in the normal direction of the bonding member 230. On the other hand, the heat conductivity A234 in the normal direction of the peripheral portion 234 is lower than the heat conductivity A232 in the normal direction of the central portion 232, but the heat conductivity B234 in the surface direction of the peripheral portion 234 is greater than the heat conductivity B232 in the surface direction of the central portion 232. Therefore, the peripheral portion 234 can transfer more heat in the surface direction of the bonding member 230 than the central portion 232, thus allowing the heat from the semiconductor element 14 to be transferred to a wide range of the cooler 50. That is, the semiconductor device 202 according to the third embodiment, too, can achieve high heat dissipation performance by utilizing the bonding member 230 shaped in a sheet and made of insulating resin.

The following describes a correspondence relationship between the present embodiment and the claims. A portion of the central portion 232 that overlaps with the semiconductor element 14 When observed along the normal direction is an example of the "first portion". A portion of the central portion 232 that does not overlap with the semiconductor element 14 when observed along the normal direction (i.e., a portion located between the semiconductor element 14 and the position apart from the semiconductor element 14 by the distance corresponding to the thickness T1 of the heatsink 12) is an example of a "third portion". A portion of the peripheral portion 134 that overlaps with the end surface 16a of the mold resin 16 is an example of the "second portion".

(Fourth Embodiment)

Figure 6:
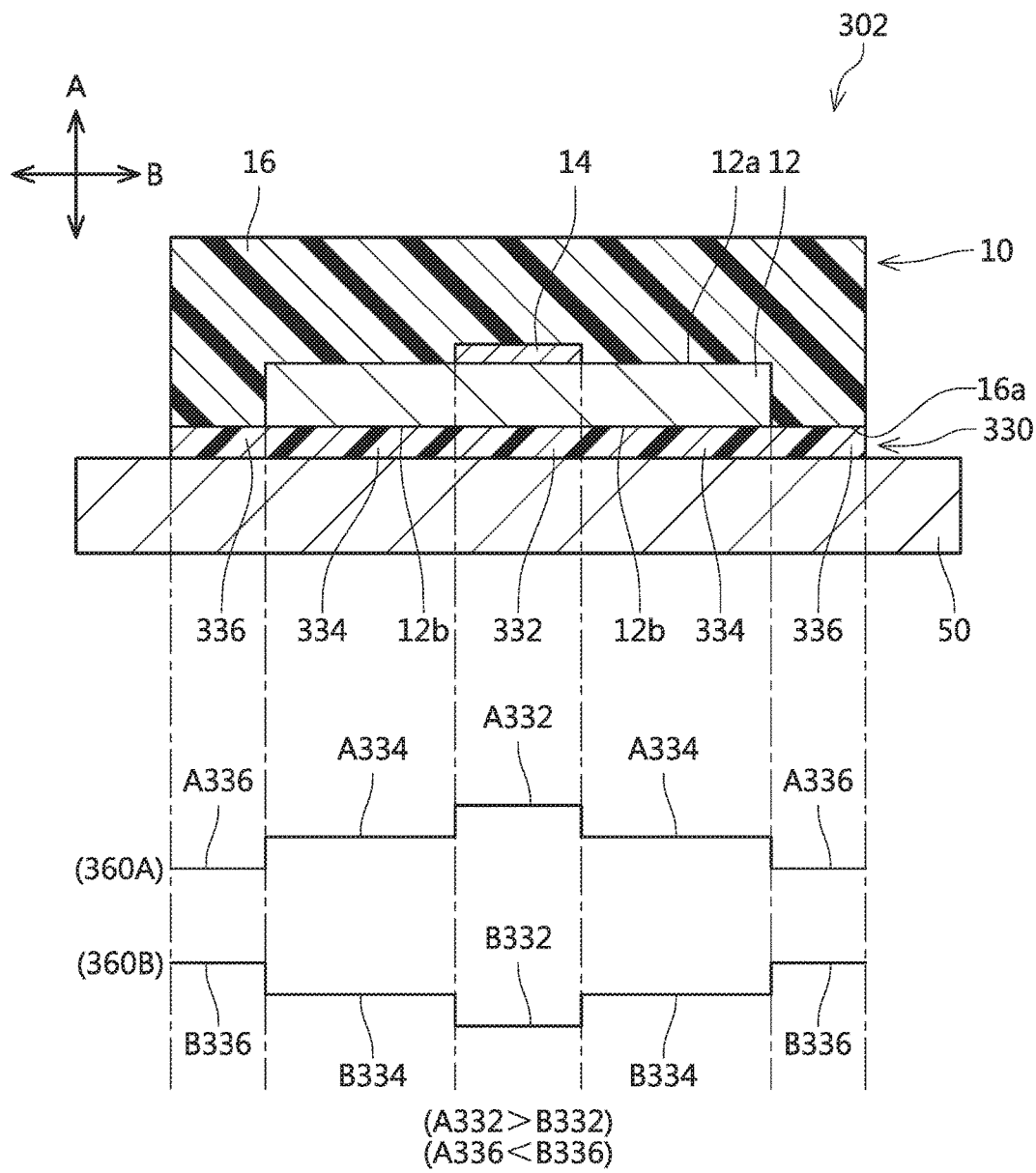
FIG. 6 is a cross-sectional explanatory diagram schematically showing a semiconductor device 302 according to a fourth embodiment.

A semiconductor device 302 according to a fourth embodiment is described with reference to FIG. 6 with a focus on points of difference from the first embodiment. In FIG. 6, too, components of the semiconductor device 302 according to the present embodiment that are identical to those of the semiconductor device 2 according to the first embodiment (see FIG. 1) are given the same reference signs as in FIG. 1.

A bonding member 330 according to the present embodiment is also a member shaped in a sheet and made of electrically-insulating resin. In the present embodiment, too, the heatsink 12 and the cooler 50 are electrically insulated from each other by the bonding member 330. As shown in FIG. 6, the bonding member 330 includes a central portion 332, an outside portion 334, and a peripheral portion 336.

The central portion 332 is a portion overlapping with the semiconductor element 14 when observed along the normal direction of the heatsink 12. The outside portion 334 is a portion located outside of the central portion 332 and is a portion not overlapping with the semiconductor element 14 but overlapping with the heatsink 12 when observed along the normal direction. The peripheral portion 336 is a portion located outside of the outside portion 334 and is a portion overlapping with the end surface 16a of the mold resin 16 when observed along the normal direction.

Although not shown in FIG. 6, in the present embodiment, a portion of the outer surface 12h of the heatsink 12 of the semiconductor module 10 that bees the outside portion 334 projects to a bonding member 330 side than a portion of the outer surface 12b of the heatsink 12 that faces the central portion 332. Further, the end surface 16a of the mold resin 16 projects to the bonding member 330 side than the portion of the outer surface 12b of the heatsink 12 that faces the outside portion 334.

In the present embodiment, the central portion 332, the outside portion 334, and the peripheral portion 336 differ in heat conductivity performance from one another As indicated in a graph 360A, heat conductivities A332, A334, A336 in a normal direction (direction of an arrow A in FIG.

6) of the respective portions 332, 334, 336 are in a descending order of A332, A334, A336. On the other hand, as indicated in a graph 360B, heat conductivities B332, B334, B336 in a surface direction (direction of an anew B in FIG. 6) of the respective portions 332, 334, 336 are in a descending order B336, B334, B332. Further, the heat conductivity A332 in the normal direction of the central portion 332 is greater than the heat conductivity B332 in the surface direction of the central portion 332. Furthermore, the heat conductivity B336 in the surface direction of the peripheral portion 336 is greater than the heat conductivity A336 in the normal direction of the peripheral portion 336. The heat conductivity A334 in the normal direction of the outside portion 334 is greater than the heat conductivity B334 in the surface direction of the outside portion 334. Note, however, that, in a modification, the heat conductivity A334 may be lower than or equal to the heat conductivity B334.

Detailed internal structures of the central portion 332 and the peripheral portion 336 (such as the postures of the dispersion particles 40 in each portion) are identical to the internal structures of the central portion 32 and the peripheral portion 34 according to the first embodiment (see FIG. 2), respectively. The proportion of the dispersion particles 40 whose longitudinal direction extends along the normal direction is lower in the outside portion 334 than in the central portion 332 and higher in the outside portion 334 than in the peripheral portion 336.

When the semiconductor device 302 described above is brought into operation, the semiconductor element 14 generates heat. The heat generated from the semiconductor element 14 is dissipated to the cooler 50 via the heatsink 12 and the bonding member 330. At this occasion, the heat conductivity A332 in the normal direction of the central portion 332 is greater than the heat conductivity B332 in the surface direction of the central portion 332. Therefore, the central portion 332 can cool the semiconductor element 14 by transferring the heat in the normal direction of the bonding member 330. The heat conductivity A334 in the normal direction of the outside portion 334 is lower than the heat conductivity A332 in the normal direction of the central portion 332, but the heat conductivity B334 in the surface direction of the outside portion 334 is greater than the heat conductivity B332 in the surface direction of the central portion 332. Therefore, the outside portion 334 can transfer heat in the normal direction and also in the surface direction of the bonding member 330. Furthermore, the heat conductivity A336 in the normal direction of the peripheral portion 336 is lower than the heat conductivity A334 in the normal direction of the outside portion 334, but the heat conductivity B336 M the surface direction of the peripheral portion 336 is greater than the heat conductivity B334 in the surface direction of the outside portion 334. Therefore, the peripheral portion 336 can transfer more heat in the surface direction of the bonding member 330 than the outside portion 334, thus allowing the heat from the semiconductor element 14 to be transferred to a wide range of the cooler 50. That is, the semiconductor device 302 according to the fourth embodiment, too, can achieve high heat dissipation performance by utilizing the bonding member 330 shaped in a sheet and made of insulating resin.

The following describes a correspondence relationship between the fourth embodiment and the claims. The central portion 332 is an example of the "first portion". The peripheral portion 336 is an example of the "second portion".

(Fifth Embodiment)

Figure 7:
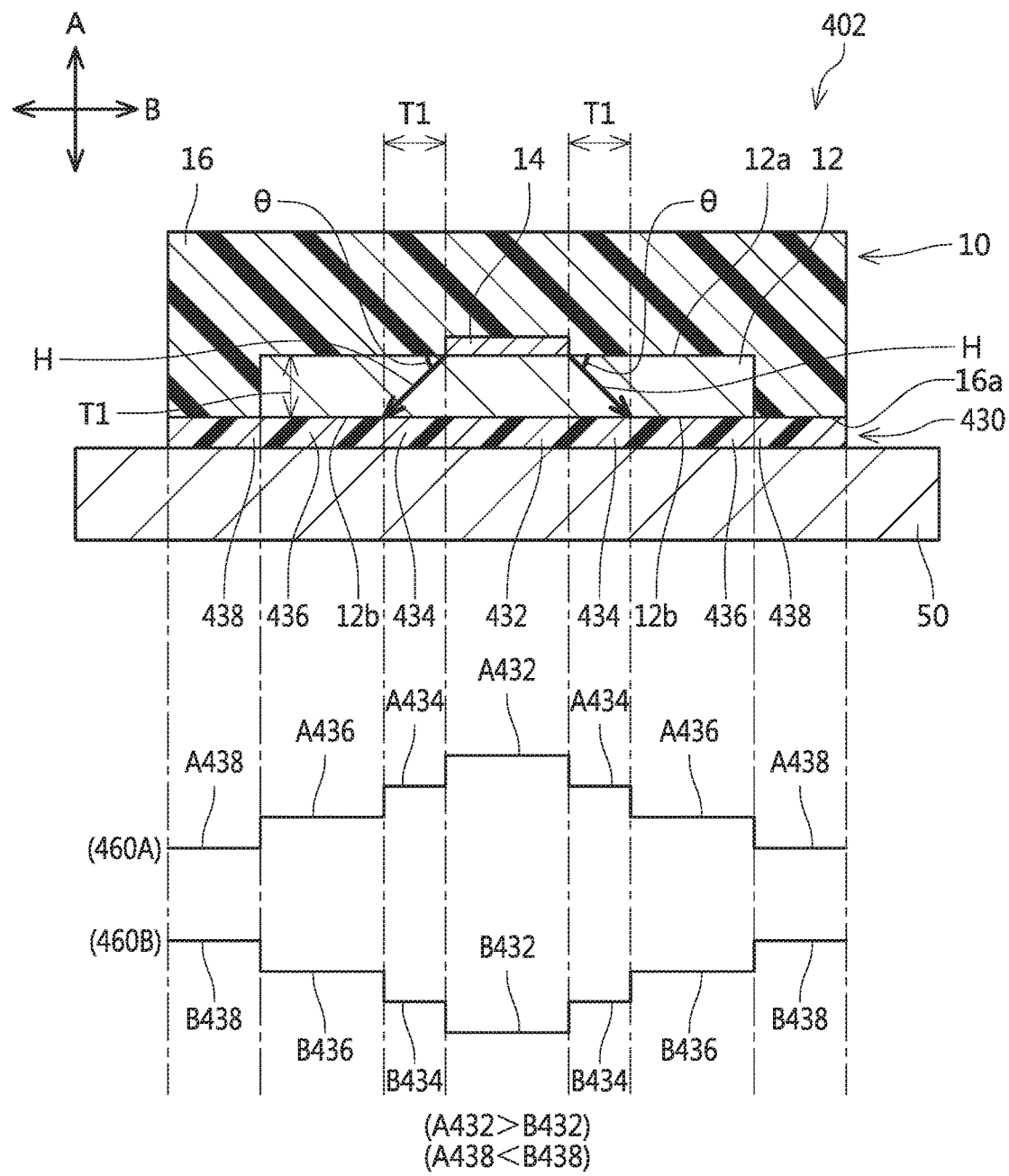
FIG. 7 is a cross-sectional explanatory diagram schematically showing a semiconductor device 402 according to a fifth embodiment.

The present embodiment is a modification of the third embodiment (see FIG. 5). A semiconductor device 402 according to the present embodiment is described with reference to FIG. 7 with a focus on points of difference from the third embodiment. In FIG. 7, too, components of the semiconductor device 402 according to the present embodiment that are identical to those of the semiconductor device 202 according to the third embodiment (see FIG. 5) are given the same reference signs as in FIG. 5.

A bonding member 430 according to the fifth embodiment is also a member shaped in a sheet and made of electrically-insulating resin. In the present embodiment, too, the heatsink 12 and the cooler 50 are electrically insulated from each other by the bonding member 430. As shown in FIG. 7, the bonding member 430 includes a central portion 432, a first outside portion 434, a second outside portion 436, and a peripheral portion 438.

The central portion 432 is a portion overlapping with the semiconductor element 14 when observed along the normal direction. The first outside portion 434 is a portion located outside of the central portion 432 and is a portion positioned, when observed along a normal direction (direction of an arrow A in FIG. 7), between the semiconductor element 14 and the position apart from the semiconductor element 14 by the distance corresponding to the thickness T1 of the heatsink 12. In other words, the first outside portion 434 is a portion to which the heat from the semiconductor element 14 is transferred via the heatsink 12. The second outside portion 436 is a portion located outside of the first outside portion 434 and is a portion which overlaps with the heatsink 12 when observed along the normal direction but to which the heat from the semiconductor element 14 is not transferred via the heatsink 12. The peripheral portion 438 is a portion located outside of the second outside portion 436 and is a portion overlapping with the end surface 16a of the mold resin 16 when observed along the normal direction.

Although not shown in FIG. 7, in the present embodiment, a portion of the outer surface 12b of the heatsink 12 of the semiconductor module 10 that faces the first outside portion 434 projects to a bonding member 430 side than a portion of the outer surface 12b of the heatsink 12 that faces the central portion 432. Further, a portion of the outer surface 12b of the heatsink 12 that faces the second outside portion 436 projects to the bonding member 430 side than the portion of the outer surface 12b of the heatsink 12 that faces the first outside portion 434. Further, the end surface 16a of the mold resin 16 projects to the bonding member 430 side than the portion of the outer surface 12b of the heatsink 12 that faces the second outside portion 436.

In the present embodiment, the central portion 432, the first outside portion 434, the second outside portion 436, and the peripheral portion 438 differ in heat conductivity performance from one another. As indicated in a graph 460A, heat conductivities A432, A434, A436, A438 in the normal direction of the respective portions 432 to 438, are in a descending order of A432, A434, A436, A438. On the other hand, as indicated in a graph 460B, heat conductivities B432, B434, B436, B438 in a surface direction (direction of an arrow B in FIG. 7) of the respective portions 432 to 438 are in a descending order of B438, B436, B434, B432. Further, the heat conductivity A432 in the noting direction of the central portion 432 is greater than the heat conductivity B432 in the surface direction of the central portion 432. Furthermore, the heat conductivity B438 in the surface direction of the peripheral portion 438 is greater than the heat conductivity A438 in the normal direction of the peripheral portion 438. The heat conductivity A434 in the normal direction of the first outside portion 434 is greater than the heat conductivity B434 in the surface direction of the first outside portion 434. The heat conductivity B436 in the surface direction of the second outside portion 436 is greater than the heat conductivity A436 in the normal direction of the second outside portion 436.

Detailed internal structures of the central portion 432 and the peripheral portion 438 (such as the postures of the dispersion particles 40 in each portion) are identical to the internal structures of the central portion 32 and the peripheral portion 34 according to the first embodiment (see FIG. 2), respectively. In the first outside portion 434 according to the present embodiment, the proportion of the dispersion particles 40 whose longitudinal direction extends along the normal direction is lower than in the central portion 432 and higher than in the second outside portion 436. In the second outside portion 436, the proportion of the dispersion particles 40 whose longitudinal direction extends along the normal direction is lower than in the first outside portion 434 and higher than in the peripheral portion 438.

When the semiconductor device 402 described above is brought into operation, the semiconductor element 14 generates heat. The heat generated from the semiconductor element 14 is dissipated to the cooler 50 via the heatsink 12 and the bonding member 430. At this occasion, the heat conductivity A432 in the normal direction of the central portion 432 is greater than the heat conductivity B432 in the surface direction of the central portion 432. Therefore, the central portion 432 can cool the semiconductor element 14 by transferring the heat in the normal direction of the bonding member 430. The heat conductivity A434 in the normal direction of the first outside portion 434 is lower than the heat conductivity A432 in the normal direction of the central portion 432, but the heat conductivity B434 in the surface direction of the first outside portion 434 is greater than the heat conductivity B432 in the surface direction of the central portion 432. The first outside portion 434 can transfer heat in the normal direction of the bonding member 430 and also in the surface direction of the bonding member 430. The second outside portion 436 can transfer more heat in the surface direction than the first outside portion 434. Furthermore, the peripheral portion 438 can transfer more heat in the surface direction of the bonding member 430 than the second outside portion 436, thus allowing the heat from the semiconductor element 14 to be transferred to a wide range of the cooler 50. That is, the semiconductor device 402 according to the present embodiment also can achieve high heat dissipation performance by utilizing the bonding member 430 shaped in a sheet and made of insulating resin.

The following describes a correspondence relationship between the present embodiment and the claims. The central portion 432 is an example of the "first portion". The peripheral portion 438 is an example of the "second portion". The first outside portion 434 is an example of the "third portion".

Specific examples of the technology disclosed herein have been described in detail above. However, these specific examples are merely examples and are not intended to limit the scope of claims. Technologies recited in the claims encompass various modifications and alternations of the specific examples described above. For example, the following modifications may be employed.

(Modification 1) In the first to third embodiments described above, the bonding member 30 (120, 230) is a sheet member including the central portion 32 (132, 232) and the peripheral portion 34 (134, 234). Similarly, in the fourth embodiment, the bonding member 330 is a sheet member including the central portion 332, the outside portion 334 and the peripheral portion 336. Further, in the fifth embodiment, the bonding member 430 is a sheet member including the central portion 432, the first outside portion 434, the second outside portion 436, and the peripheral portion 438. This does not imply any limitation, and in each of the embodiments described above, each of the respective portions (such as the central portion, the peripheral portion, and the outside portion) may be constituted by separated sheet members. Therefore, for example, the bonding member may be a combination of a sheet member constituting a central portion and a sheet member constituting a peripheral portion.

(Modification 2) In a case where Modification 1 described above is employed, the end surface 16*a* of the mold resin 16 and the outer surface 12*b* of the heatsink 12 may be substantially flush with each other.

(Modification 3) In each of the embodiments described above, the bonding member 30 (130, 230, 330, 430) comprises a characteristic of having the heat conductivity in the normal direction and the heat conductivity in the surface direction that change in accordance with postures of the dispersion particles 40. The bonding member is not limited to one including dispersion particles and may be one including any given structure, as long as it is a sheet member made of resin that can achieve the heat conductivity performance of each of the portions described above.

(Modification 4) In each of the embodiments described above, the heat conductivity in the surface direction of the peripheral portion 34 (134, 234, 336, 438) is greater than the heat conductivity in the normal direction of the peripheral portion 34 (134, 234, 336, 438). This does not imply any limitation, and the heat conductivity in the surface direction of the peripheral portion 34 (134, 234, 336, 438) may not need to be greater than the heat conductivity in the normal direction of the peripheral portion 34 (134, 234, 336, 438). That is, the heat conductivity in the normal direction of the peripheral portion may be equal to or greater than the heat conductivity in the surface direction of the peripheral portion. In that case, it is only necessary that the heat conductivity in the normal direction of the central portion 32 (132, 232, 332, 432) be greater than the heat conductivity in the normal direction of the peripheral portion 34 (134, 234, 336, 438), that the heat conductivity in the surface direction of the peripheral portion 34 (134, 234, 336, 438) be greater than the heat conductivity in the surface direction of the central portion 32 (132, 232, 332, 432), and that the heat conductivity in the normal direction of the central portion 32 (132, 232, 332, 432) be greater than the heat conductivity in the surface direction of the central portion 32 (132, 232, 332, 432).

(Modification 5) In each of the embodiments described above, an example has been described in which an IGBT is used as a switching element This does not imply any limitation, and another switching element such as a MOSFET may be used as a switching element.

Some of technical elements disclosed herein are enumerated below It should be noted that the technical elements enumerated below are each independently useful.

In the semiconductor device disclosed herein, the bonding member may comprise an electrical insulating material containing dispersion particles dispersed therein, the dispersion particles having a higher heat conductivity than the electrical insulating material, and the bonding member may comprise a characteristic of having the heat conductivity in the normal direction and the heat conductivity in the surface direction that change in accordance with postures of the dispersion particles. A proportion of the dispersion particles with a posture that increases the heat conductivity of the normal direction may be higher in the first portion than in the second portion. A proportion of the dispersion particles with a posture that increases the heat conductivity of the surface direction may he higher in the second portion than in the first portion.

This configuration can achieve high heat dissipation performance even in the case where the bonding member comprises a characteristic of having the heat conductivity in the normal direction and the heat conductivity in the surface direction that change in accordance with postures of the dispersion particles.

In the semiconductor device disclosed herein, the bonding member may further comprise a third portion that is adjacent to the first portion and is positioned, when observed along the normal direction, between the semiconductor element and a position apart from the semiconductor element by a distance corresponding to a thickness of the heatsink. A heat conductivity in the normal direction of the third portion may be greater than the heat conductivity in the normal direction of the second portion, a heat conductivity in the surface direction of the third portion may be smaller than the heat conductivity in the surface direction of the second portion, and the heat conductivity in the normal direction of the third portion may be greater than the heat conductivity in the surface direction of the third portion.

The heat generated from the semiconductor element is radially transferred through the heatsink. It is also known than a radiation angle at that occasion is approximately 45 degrees. According to the configuration described above, when observed along the normal direction, the third portion is located between the semiconductor element and the position apart from the semiconductor element by the distance corresponding to the thickness of the heatsink. That is, the heat from the semiconductor element is transferred to the first portion and the third portion via the heatsink. The first portion and the third portion effectively cool the semiconductor element by efficiently transferring the heat in the normal direction of the bonding member. On the other hand, the second portion, which overlaps with the mold resin when observed along the normal direction and to which the heat from the semiconductor element is not transferred in the normal direction, can transfer more heat in the surface direction of the bonding member than the first portion, thus allowing the heat from the semiconductor element to be transferred to a wide range of the cooler.

In the semiconductor device disclosed herein, the mold resin slalom the circumference of the heatsink may have an end surface, on a bonding member side, that projects to the bonding member side than the outer surface of the heatsink. A proportion of the dispersion particles extending along the normal direction may be higher in the first portion than in the second portion, and a proportion of the dispersion particles extending along the surface direction may be higher in the second portion than in the first portion.

According to this configuration, in the process of manufacturing the semiconductor device, when the bonding member, which contains the dispersion particles dispersed therein with a posture that causes the heat conductivity in the normal direction to be greater than the heat conductivity in the surface direction, is disposed between the cooler and the end surface of the mold resin surrounding the out surface of the heatsink and the circumference of the heatsink; and the semiconductor module is pressure-bonded to the cooler via the bonding member, a higher pressure is applied to a portion of the bonding member that faces the mold resin than to a portion of the bonding member that faces the heatsink. As a result, the portion of the bonding member that faces the mold resin can cause the postures of more of the dispersion particles to be changed than the portion of the bonding member that faces the heatsink. Consequently, in the bonding member thus formed, a proportion of the dispersion particles with a posture that increases the heat conductivity of the normal direction is higher in the portion of the bonding member that faces the outer surface of the heatsink than in the portion of the bonding member that faces the mold resin, and a proportion of the dispersion particles with a posture that increases the heat conductivity of the surface direction is higher in the portion of the bonding member that faces the mold resin than in the portion of the bonding member that faces the outer surface of the heatsink. This configuration makes it possible to manufacture the semiconductor device described above without preparing in advance a bonding member with different postures of the dispersion particles for each separate portion.

The technical elements explained in the present description or drawings provide technical utility either independently or through various combinations. The present teachings are not limited to the combinations described at the time the claims are filed. Further, the purpose of the examples illustrated by the present description or drawings is to satisfy multiple objectives simultaneously, and satisfying any one of those objectives gives technical utility to the present teachings.

What is claimed is:

1. A semiconductor device comprising:
    a semiconductor module;
    a bonding member; and
    a cooler,
    wherein the semiconductor module comprises:
    a heatsink;
    a semiconductor element disposed at an inner surface side of the heatsink; and
    mold resin sealing the inner surface side of the heatsink and a circumference of the semiconductor element,
    wherein an outer surface of the heatsink is exposed on a surface of the semiconductor module that is bonded to the cooler via the bonding member, and the mold resin surrounds a circumference of the heatsink,
    the bonding member is shaped in a sheet and made of insulating resin, the bonding member comprises a first portion overlapping with the semiconductor element and a second portion overlapping with the mold resin when observed along a normal direction of the heatsink, wherein a heat conductivity in the normal direction of the first portion is greater than a heat conductivity in the normal direction of the second portion, when a direction perpendicular to the normal direction is set as a surface direction, a heat conductivity in the surface direction of the second portion is greater than a heat conductivity in the surface direction of the first portion, and the heat conductivity in the normal direction of the first portion is greater than the heat conductivity in the surface direction of the first portion, and
    the outer surface of the heatsink and the mold resin surrounding the circumference of the heatsink are bonded to the cooler via the bonding member.

2. The semiconductor device as in claim 1, wherein the bonding member comprises an electrical insulating material containing dispersion particles dispersed therein, the dispersion particles having a higher heat conductivity than the electrical insulating material, and the bonding member comprises a characteristic of having the heat conductivity in the normal direction and the heat conductivity in the surface direction that change in accordance with postures of the dispersion particles, a proportion of the dispersion particles with a posture that increases the heat conductivity of the normal direction is higher in the first portion than in the second portion, and a proportion of the dispersion particles with a posture that increases the heat conductivity of the surface direction is higher in the second portion than in the first portion.

3. The semiconductor device as in claim 1, wherein the bonding member further comprises a third portion that is adjacent to the first portion and is positioned, when observed along the normal direction, between the semiconductor element and a position apart from the semiconductor element by a distance corresponding to a thickness of the heatsink, a heat conductivity in the normal direction of the third portion is greater than the heat conductivity in the normal direction of the second portion, a heat conductivity in the surface direction of the third portion is smaller than the heat conductivity in the surface direction of the second portion, and the heat conductivity in the normal direction of the third portion is greater than the heat conductivity in the surface direction of the third portion.

4. The semiconductor device as in claim 2, wherein the mold resin surrounding the circumference of the heatsink has an end surface, on a bonding member side, that projects to the bonding member side than the outer surface of the heatsink, a proportion of the dispersion particles extending along the normal direction is higher in the first portion than in the second portion, and a proportion of the dispersion particles extending along the surface direction is higher in the second portion than in the first portion.

5. A manufacturing method of the semiconductor device as in claim 1, the method comprising:

disposing the semiconductor element at an inner surface side of the heatsink;

forming mold resin such that the mold resin seals the inner surface side of the heatsink and a circumference of the semiconductor element, and surrounds a circumference of the heatsink, the surrounding portion of the mold resin projects to a bonding member side than an outer surface of the heatsink;

disposing the bonding member between the cooler and an end surface of the mold resin surrounding the outer surface of the heatsink and a circumference of the heatsink, the bonding member containing dispersion particles dispersed therein with a posture that causes a heat conductivity in a normal direction to be greater than a heat conductivity in a surface direction; and pressure-bonding the outer surface of the heatsink and the end surface of the mold resin to the cooler via the bonding member, so as to cause the posture of the dispersion particles contained in the bonding member in a range positioned between the end surface of the mold resin and the cooler to be changed.

* * * * *